(12) United States Patent
Zaima et al.

(10) Patent No.: US 11,929,210 B2
(45) Date of Patent: Mar. 12, 2024

(54) MULTI-LAYER CERAMIC ELECTRONIC COMPONENT AND CIRCUIT BOARD

(71) Applicant: TAIYO YUDEN CO., LTD., Tokyo (JP)

(72) Inventors: Tomohiko Zaima, Tokyo (JP); Takashi Sasaki, Tokyo (JP); Kunihiro Matsushita, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 197 days.

(21) Appl. No.: 17/696,651

(22) Filed: Mar. 16, 2022

(65) Prior Publication Data

US 2022/0310324 A1    Sep. 29, 2022

(30) Foreign Application Priority Data

Mar. 25, 2021    (JP) .................................. 2021-051014

(51) Int. Cl.
    *H01G 4/26*     (2006.01)
    *H01G 4/248*     (2006.01)
    *H01G 4/30*     (2006.01)
    *H05K 1/18*     (2006.01)

(52) U.S. Cl.
    CPC .............. *H01G 4/248* (2013.01); *H01G 4/30* (2013.01); *H05K 1/181* (2013.01)

(58) Field of Classification Search
    CPC ..................................................... H01G 4/248
    USPC ...................................................... 174/260
    See application file for complete search history.

(56) References Cited

U.S. PATENT DOCUMENTS

| 2012/0300361 | A1* | 11/2012 | Togashi | H01G 4/12 |
| | | | | 156/89.12 |
| 2018/0082785 | A1* | 3/2018 | Asano | H01G 4/232 |
| 2020/0090872 | A1 | 3/2020 | Sasaki | |
| 2021/0241976 | A1* | 8/2021 | Nakano | H01G 11/26 |
| 2021/0335550 | A1* | 10/2021 | Ikeda | H01G 4/232 |
| 2022/0108840 | A1* | 4/2022 | Yokomizo | H01G 4/2325 |
| 2022/0230811 | A1* | 7/2022 | Lee | H01G 4/012 |
| 2023/0162922 | A1* | 5/2023 | Kokawa | H01G 4/012 |
| | | | | 361/301.4 |

FOREIGN PATENT DOCUMENTS

JP      2020-43272 A      3/2020

* cited by examiner

*Primary Examiner* — Stanley Tso
(74) *Attorney, Agent, or Firm* — Stein IP, LLC

(57) ABSTRACT

A multi-layer ceramic electronic component includes: a ceramic body including a main surface, an end surface, and a side surface respectively perpendicular to a first axis, a second axis, and a third axis orthogonal to one another, a top portion that connects the main surface, the end surface, and the side surface to one another, and a plurality of internal electrodes laminated in a direction of the first axis; and an end external electrode including a corner portion located on the top portion, a base portion that covers the end surface and extends from the end surface to the main surface and the side surface, and a protrusion that protrudes from the base portion in a thickness direction, the protrusion including an L-shaped main surface protrusion located on the main surface and extending in directions of the second axis and the third axis from the corner portion.

11 Claims, 11 Drawing Sheets

MULTI-LAYER CERAMIC ELECTRONIC COMPONENT AND CIRCUIT BOARD

CROSS-REFERENCE TO RELATED APPLICATIONS

This application claims the benefit of Japanese Application No. 2021-051014, filed Mar. 25, 2021, in the Japanese Patent Office. All disclosures of the document(s) named above are incorporated herein by reference.

BACKGROUND ART

The present disclosure relates to a multi-layer ceramic electronic component including an external electrode and to a circuit board.

When a multi-layer ceramic capacitor is mounted using solder, air may be mixed into the solder and then voids may be generated. As a result, the heat dissipation of the multi-layer ceramic capacitor tends to stagnate, and cracks starting from the voids are likely to be generated. Thus, there is a demand for a technique of preventing voids from being generated in solder.

Japanese Patent Application Laid-open No. 2020-43272 discloses a multi-layer ceramic capacitor that is configured such that air, which has been mixed into solder during mounting, easily escapes to the outside. Specifically, in such a multi-layer ceramic capacitor, a rotation is caused by the surface tension that acts on the external electrode from the molten solder, to promote the discharge of the air from the molten solder.

SUMMARY OF THE INVENTION

In order to prevent voids from being generated in solder, it is effective to discharge the air mixed into the solder while the solder is in the molten state as described above, but it is considered to be more effective to prevent the air from being mixed into the solder in the first place. In other words, when a multi-layer ceramic capacitor is mounted, a technique capable of suppressing the mixture of air into the solder is expected.

In view of the circumstances as described above, it is an object of the present disclosure to provide a multi-layer ceramic electronic component and a circuit board, in which voids are hardly generated in solder during mounting.

Additional or separate features and advantages of the disclosure will be set forth in the descriptions that follow and in part will be apparent from the description, or may be learned by practice of the disclosure. The objectives and other advantages of the disclosure will be realized and attained by the structure particularly pointed out in the written description and claims thereof as well as the appended drawings.

To achieve the above object, a multi-layer ceramic electronic component according to an embodiment of the present disclosure includes a ceramic body and an end external electrode.

The ceramic body includes a main surface, an end surface, and a side surface that are respectively perpendicular to a first axis, a second axis, and a third axis orthogonal to one another, a top portion that connects the main surface, the end surface, and the side surface to one another, and a plurality of internal electrodes laminated in a direction of the first axis.

The end external electrode includes a corner portion located on the top portion, a base portion that covers the end surface and extends from the end surface to the main surface and the side surface, and a protrusion that protrudes from the base portion in a thickness direction.

The protrusion includes an L-shaped main surface protrusion that is located on the main surface and extends in a direction of the second axis and in a direction of the third axis from the corner portion.

An amount of protrusion of the main surface protrusion from the base portion is favorably 3 μm or more and 50 μm or less.

An amount of protrusion of the main surface protrusion from the base portion is favorably 5 μm or more and 30 μm or less.

The protrusion may further include an end surface protrusion extending in the direction of the first axis from the main surface protrusion along the end surface.

An amount of protrusion of the end surface protrusion from the base portion is favorably 3 μm or more and 50 μm or less.

The protrusion may further include a side surface protrusion extending in the direction of the first axis from the main surface protrusion along the side surface.

An amount of protrusion of the side surface protrusion from the base portion is favorably 3 μm or more and 50 μm or less.

In this configuration, the protrusion is provided at the corner portion of the end external electrode, and thus solder sequentially wets and spreads around the corner with the corner as a starting point during mounting. In such a manner, the flow of the solder at the end external electrode when the solder wets and spreads is defined in advance, and thus the mixture of air into the solder in the process of wetting and spreading onto the end external electrode is effectively suppressed, so that voids are less likely to be generated in the solder.

In particular, the L-shaped main surface protrusion is provided to the end external electrode, and thus the solder can be caused to wet and spread in the flow where air is more hardly mixed, in the region of the end external electrode, which is to face the connection electrode of the mounting board. Thus, the connection by the solder between the end external electrode and the connection electrode of the mounting board is less likely to be inhibited by voids.

The multi-layer ceramic electronic component may further include a central external electrode that is provided along the main surface and the side surface at the central portion of the ceramic body in the direction of the second axis and has a thickness on the main surface, which is larger than a thickness of the base portion and smaller than a thickness of the main surface protrusion.

In such a multi-layer ceramic electronic component, good connection with the connection electrode of the mounting board through the solder of the central external electrode is obtained while the above effects are effectively obtained in a three-terminal type configuration.

To achieve the above object, a circuit board according to an embodiment of the present disclosure includes a multi-layer ceramic electronic component, and a mounting board including a connection electrode.

The multi-layer ceramic electronic component includes a ceramic body and an end external electrode.

The ceramic body includes a main surface, an end surface, and a side surface that are respectively perpendicular to a first axis, a second axis, and a third axis orthogonal to one another, a top portion that connects the main surface, the end surface, and the side surface to one another, and a plurality of internal electrodes laminated in a direction of the first axis.

The end external electrode includes a corner portion located on the top portion, a base portion that covers the end surface and extends from the end surface to the main surface and the side surface, and a protrusion that protrudes from the base portion in a thickness direction. The end external electrode is to be connected to the connection electrode of the mounting board via solder.

The protrusion includes an L-shaped main surface protrusion that is located on the main surface and extends in a direction of the second axis and in a direction of the third axis from the corner portion.

It is an object of the present disclosure to provide a multi-layer ceramic electronic component and a circuit board, in which voids are hardly generated in solder during mounting.

These and other objects, features and advantages of the present disclosure will become more apparent in light of the following detailed description of embodiments thereof, as illustrated in the accompanying drawings.

It is to be understood that both the foregoing general description and the following detailed description are exemplary and explanatory, and are intended to provide further explanation of the disclosure as claimed.

DETAILED DESCRIPTION OF THE EMBODIMENTS

Hereinafter, embodiments of the present disclosure will be described with reference to the drawings.

In the figures, an X axis, a Y axis, and a Z axis orthogonal to one another are shown as appropriate. The X axis, the Y axis, and the Z axis are common in all figures.

1. Basic Configuration of Multi-Layer Ceramic Capacitor 10

Figure 1:
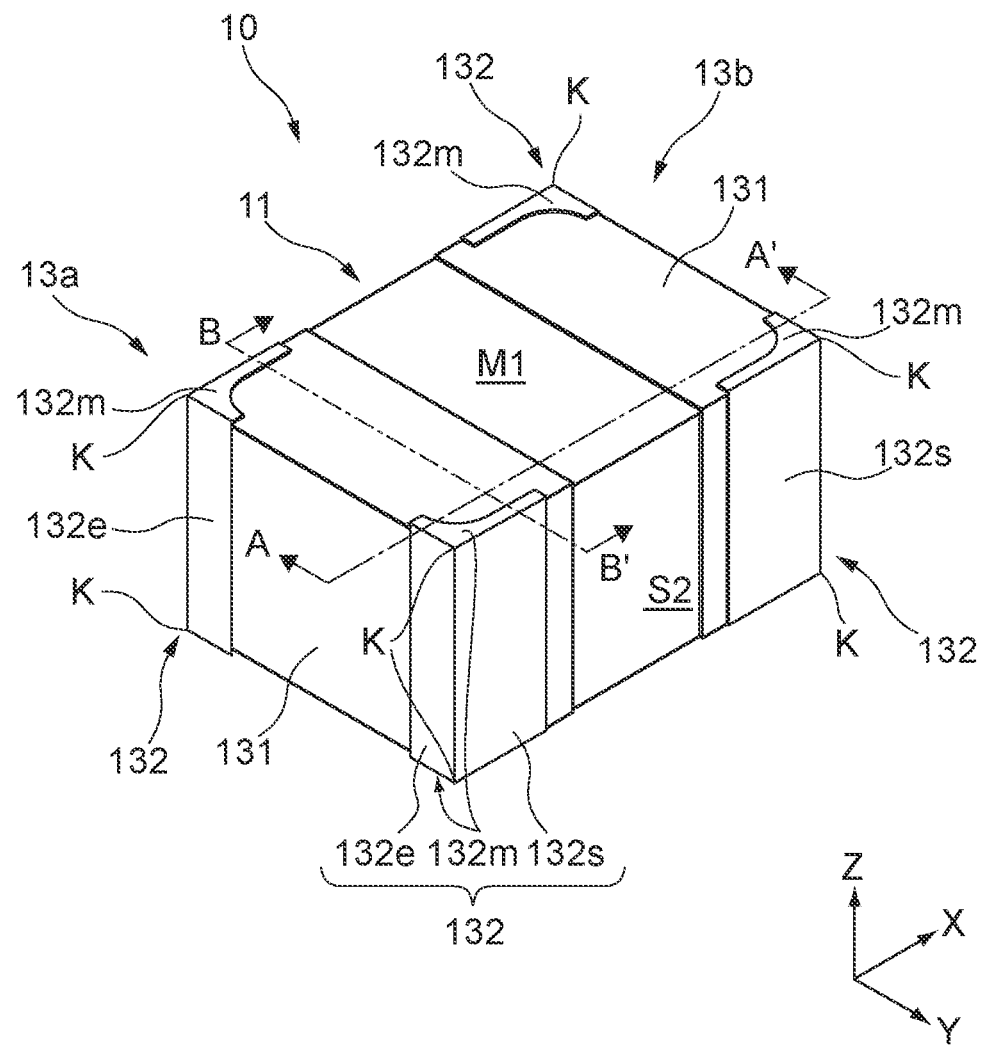
FIG. 1 is a perspective view of a multi-layer ceramic capacitor according to an embodiment of the present disclosure.
Figure 2:
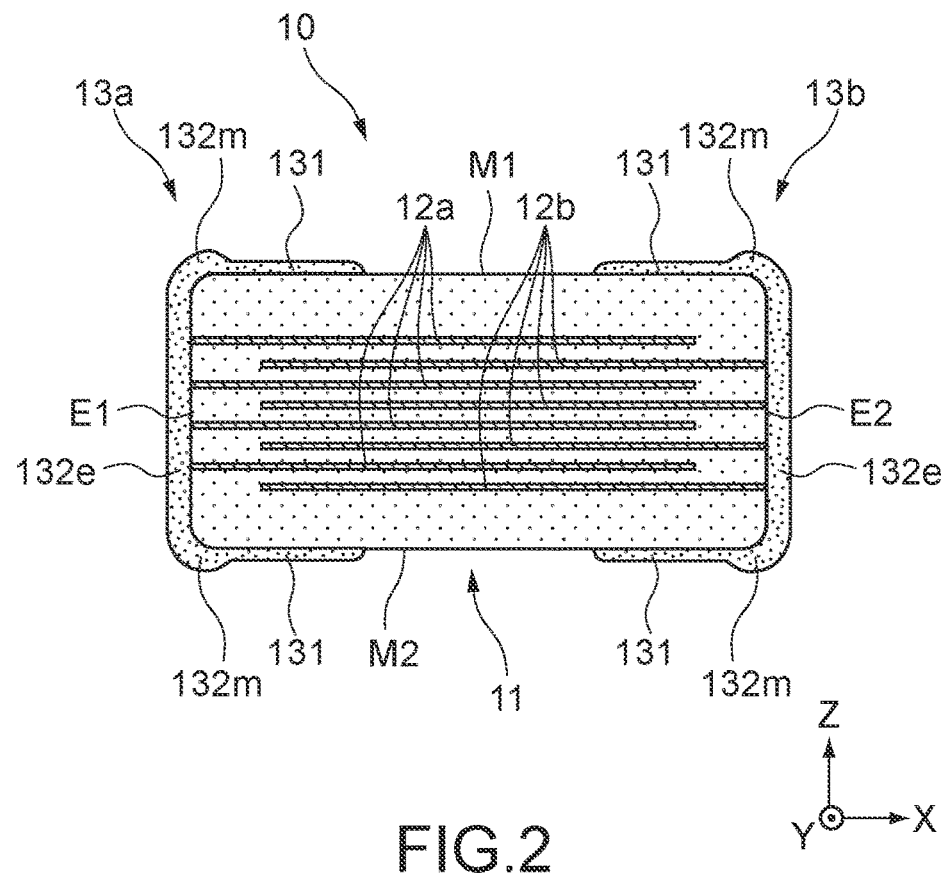
FIG. 2 is a cross-sectional view of the multi-layer ceramic capacitor taken along the line A-A' in FIG. 1.
Figure 3:
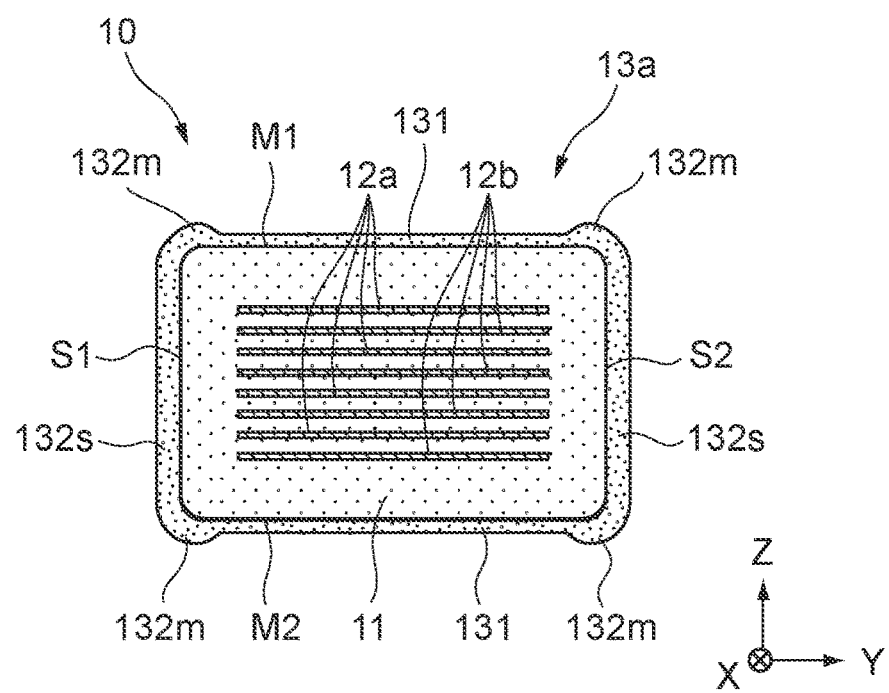
FIG. 3 is a cross-sectional view of the multi-layer ceramic capacitor taken along the line B-B' in FIG. 1.

FIGS. 1 to 3 each show a multi-layer ceramic capacitor 10 according to an embodiment of the present disclosure. FIG. 1 is a perspective view of the multi-layer ceramic capacitor 10. FIG. 2 is a cross-sectional view of the multi-layer ceramic capacitor 10 taken along the line A-A' in FIG. 1. FIG. 3 is a cross-sectional view of the multi-layer ceramic capacitor 10 taken along the line B-B' in FIG. 1.

The multi-layer ceramic capacitor 10 includes a ceramic body 11, a first end external electrode 13a, and a second end external electrode 13b. The outer surface of the ceramic body 11 includes first and second end surfaces E1 and E2 perpendicular to the X axis, first and second side surfaces S1 and S2 perpendicular to the Y axis, and first and second main surfaces M1 and M2 perpendicular to the Z axis.

Figure 7:
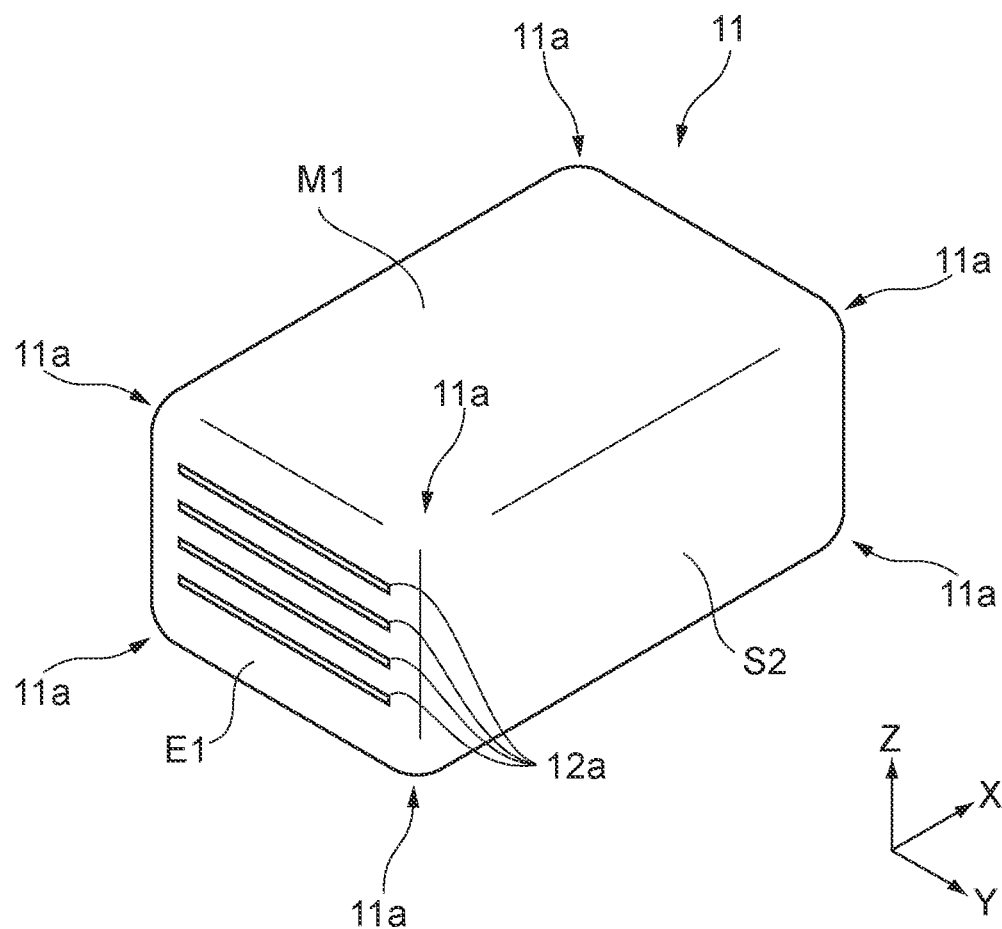
FIG. 7 is a perspective view of a ceramic body obtained in Step S02.

The ceramic body 11 has a substantially rectangular parallelepiped shape and has eight top portions 11a (see FIG. 7 and the like). In other words, the top portions 11a of the ceramic body 11 connect the first and second end surfaces E1 and E2, the first and second side surfaces S1 and S2, and the first and second main surfaces M1 and M2. It is favorable that the ceramic body 11 is chamfered and each top portion 11a is formed of a rounded curved surface.

In the multi-layer ceramic capacitor 10, the first end external electrode 13a covers the first end surface E1 of the ceramic body 11, and the second end external electrode 13b covers the second end surface E2 of the ceramic body 11. The first end external electrode 13a and the second end external electrode 13b face each other in the X-axis direction with the ceramic body 11 being interposed therebetween and function as terminals of the multi-layer ceramic capacitor 10.

The first and second end external electrodes 13a and 13b respectively extend inwardly in the X-axis direction from the first and second end surfaces E1 and E2 of the ceramic body 11 along the first and second main surfaces M1 and M2 and the first and second side surfaces S1 and S2. With this configuration, the first and second end external electrodes 13a and 13b each have a U-shaped cross section parallel to the X-Z plane shown in FIG. 2 and a U-shaped cross section parallel to the X-Y plane.

The first end external electrode 13a covers the four top portions 11a on the first end surface E1 of the ceramic body 11, and the second end external electrode 13b covers the four top portions 11a on the second end surface E2 of the ceramic body 11. In other words, each of the first and second end external electrodes 13a and 13b includes four corner portions K located on the top portions 11a of the ceramic body 11.

The first and second end external electrodes 13a and 13b are each formed of a material having high electrical conductivity. Specifically, the first and second end external electrodes 13a and 13b can be formed of, for example, a metal containing at least one element of nickel (Ni), copper (Cu), palladium (Pd), silver (Ag), or Sn (tin) as a main component, or an alloy of those metals. Note that the main component in this specification refers to a constituent element contained in the largest amount.

Each of the first and second end external electrodes 13a and 13b can include, for example, a base layer obtained by baking a conductive metal paste, and a plating layer formed on the base layer by a wet plating method. By way of example, the base layer can contain any one of Ni, Cu, Pd, and Ag as a main component. Further, the plating layer can be formed in a single layer or a multi-layer structure containing any one of Ni, Cu, Sn, Pd, and Ag as a main component.

The ceramic body 11 is formed of dielectric ceramics. The ceramic body 11 includes a plurality of first internal electrodes 12a and a plurality of second internal electrodes 12b, which are covered with dielectric ceramics. The first and second internal electrodes 12a and 12b each have a sheet-like shape extending along the X-Y plane and are alternately arranged along the Z-axis direction.

The ceramic body 11 includes an opposing region in which the first and second internal electrodes 12a and 12b face each other in the Z-axis direction across the ceramic layers. The first internal electrode 12a is drawn from the opposing region to the first end surface E1 and is connected to the first end external electrode 13a. The second internal electrode 12b is drawn from the opposing region to the second end surface E2 and is connected to the second end external electrode 13b.

With the configuration described above, when a voltage is applied between the first end external electrode 13a and the second end external electrode 13b in the multi-layer ceramic capacitor 10, the voltage is applied to a plurality of ceramic layers in the opposing region of the first and second internal electrodes 12a and 12b. With this configuration, the multi-layer ceramic capacitor 10 stores charge corresponding to the voltage applied between the first end external electrode 13a and the second end external electrode 13b.

In the ceramic body 11, in order to increase a capacitance of each ceramic layer provided between the first and second internal electrodes 12a and 12b, dielectric ceramics having a high dielectric constant is used. The dielectric ceramics can mainly include, for example, a ceramic material having a perovskite structure represented by general formula $ABO_3$. Note that the perovskite structure may contain $ABO_{3-\alpha}$ outside the stoichiometry. Examples of the ceramic material having a perovskite structure include a material containing barium (Ba) and titanium (Ti), typified by barium titanate ($BaTiO_3$). Specifically, for example, $Ba_{1-x-y}Ca_xSr_yTi_{1-z}Zr_zO_3$ ($0 \leq x \leq 1$, $0 \leq y \leq 1$, $0 \leq z \leq 1$) is included.

Note that the dielectric ceramics may have a composition system of strontium titanate ($SrTiO_3$), calcium titanate ($CaTiO_3$), magnesium titanate ($MgTiO_3$), calcium zirconate ($CaZrO_3$), calcium zirconate titanate ($Ca(Zr,Ti)O_3$), barium zirconate ($BaZrO_3$), titanium oxide ($TiO_2$), or the like.

2. Detailed Configuration of First and Second End External Electrodes 13a and 13b In the multi-layer ceramic capacitor 10, each of the first and second end external electrodes 13a and 13b includes a base portion 131 and protrusions 132. The base portion 131 is formed to be substantially flat along the surface of the ceramic body 11. The protrusion 132 is formed to be thicker than the base portion 131 and protrudes from the base portion 131 in the thickness direction. The surface of the connection portion that connects the base portion 131 and the protrusions 132 is configured as a curved surface that smoothly connects the base portion 131 and the protrusions 132 in the step formed therebetween.

More specifically, the base portions 131 of the first and second end external electrodes 13a and 13b respectively cover the first and second end surfaces E1 and E2 of the ceramic body 11, and respectively extends from the first and second end surfaces E1 and E2 to the first and second main surfaces M1 and M2 and the side surfaces S1 and S2. Further, each protrusion 132 of the first and second end external electrodes 13a and 13b constitutes the corner portions K located on the respective top portions 11a of the ceramic body 11. In the first and second end external electrodes 13a and 13b, the main component of the base portions 131 and the main component of the protrusion 132 may be a common component, and they can also be made different from each other. By way of example, a material having a smaller Young's modulus than the main component of the base portions 131 can be used as the main component of the protrusion 132 that covers a ridge of the ceramic body 11, in which cracks are likely to occur due to the concentration of thermal stress caused when the first and second end external electrodes 13a and 13b are formed. For example, if copper is used as the main component of the base portions 131, silver or an electrically conductive resin in which silver is distributed can be used as the main component of the protrusion 132. Further, if nickel is used as the main component of the base portions 131, silver, copper, or an electrically conductive resin in which at least one of silver or copper is distributed can be used as the main component of the protrusion 132.

In each of the first and second end external electrodes 13a and 13b, the protrusions 132 are provided separately at two places of a position close to the first side surface S1 and a position close to the second side surface S2. In other words, each of the four protrusions 132 provided to the first and second end external electrodes 13a and 13b collectively covers the two corresponding top portions 11a aligned in the Z-axis direction and a ridge connecting those two top portions 11a in the Z-axis direction in the ceramic body 11.

The protrusion 132 includes main surface protrusions 132m located on the first and second main surfaces M1 and M2, a side surface protrusion 132s located on the first side surface S1 or second side surface S2, and an end surface protrusion 132e located on the first end surface E1 or second end surface E2. The main surface protrusion 132m protrudes in the Z-axis direction, the side surface protrusion 132s protrudes in the Y-axis direction, and the end surface protrusion 132e protrudes in the X-axis direction.

Each main surface protrusion 132m extends along the X- and Y-axis directions from the corner portion K and has an L-shaped planar shape along the X-Y plane. Note that the planar shape of each main surface protrusion 132m is assumed to be L-shaped even if it looks strictly different from the letter "L" as long as it is shaped along the L-shaped contour of the corner portion including the top portion 11a on each of the first and second main surfaces M1 and M2.

The side surface protrusions 132s and the end surface protrusions 132e extend in the Z-axis direction along the first and second side surfaces S1 and S2 and the first and second end surfaces E1 and E2, respectively, and constitute four ridges extending in the Z-axis direction of the first and second end external electrodes 13a and 13b. The side surface protrusions 132s and the end surface protrusions 132e each connect a pair of main surface protrusions 132m, which face each other in the Z-axis direction, along the first and second side surfaces S1 and S2 and the first and second end surfaces E1 and E2, respectively.

In other words, each side surface protrusion 132s is disposed continuously from the corresponding main surface protrusions 132m and has substantially the same dimension in the X-axis direction as the dimensions of the corresponding main surface protrusions 132m. Similarly, each end surface protrusion 132e is disposed continuously from the corresponding main surface protrusions 132m and has substantially the same dimension in the Y-axis direction as the dimensions of the corresponding main surface protrusions 132m.

Figure 4A:
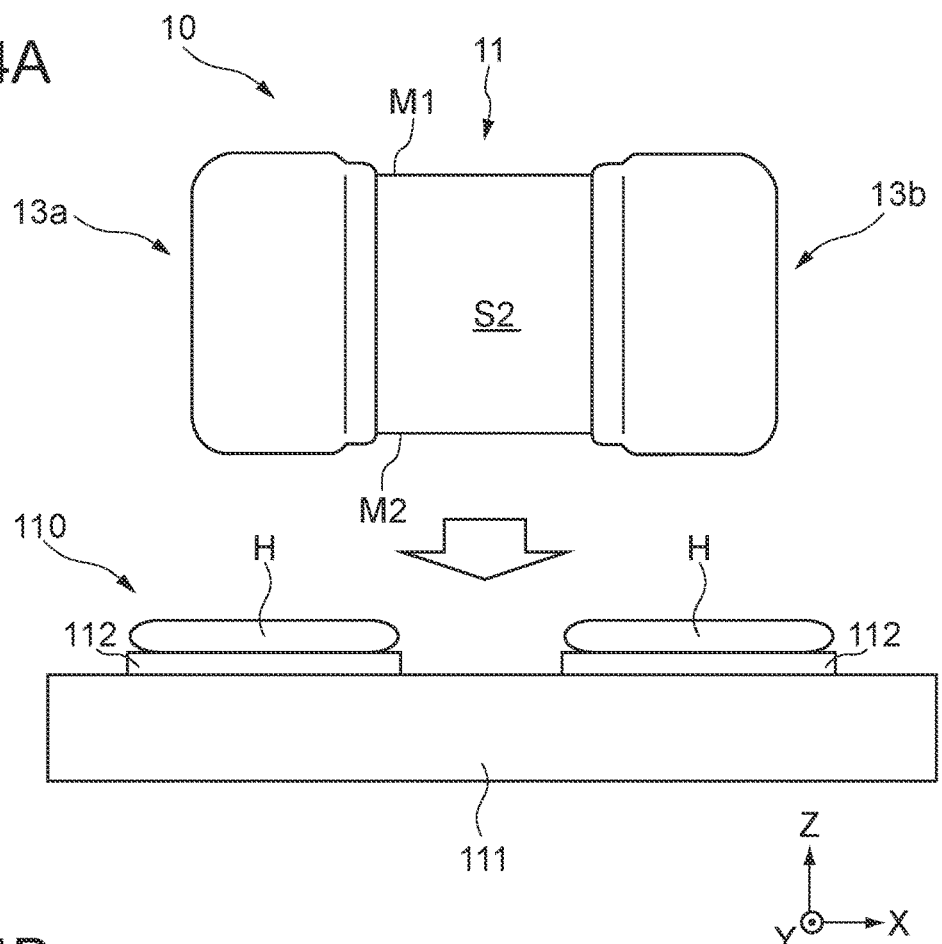
FIG. 4A is a side view showing the mounting process of the multi-layer ceramic capacitor.

FIG. 4A is a side view showing the production process of a circuit board 100 with the multi-layer ceramic capacitor 10. The circuit board 100 includes a mounting board 110 on which the multi-layer ceramic capacitor 10 is to be mounted via solder H. The mounting board 110 includes a base material 111 extending along the X-Y plane, and connection electrodes 112 provided on the base material 111.

In the mounting board 110, two connection electrodes 112 corresponding to the first and second end external electrodes 13a and 13b of the multi-layer ceramic capacitor 10 are provided, and the solder H is disposed on each of the connection electrodes 112. The multi-layer ceramic capacitor 10 is disposed on the mounting board 110 in a state where the second main surface M2 of the ceramic body 11 faces the mounting board 110 and the positions of the first and second end external electrodes 13a and 13b are aligned with the positions of the connection electrodes 112.

The mounting board 110 on which the multi-layer ceramic capacitor 10 is disposed is heated in a reflow furnace or the like, to melt the solder H on the connection electrodes 112. Thus, the solder H in the molten state wets and spreads along the surfaces of the connection electrodes 112 of the mounting board 110 and the first and second end external electrodes 13a and 13b of the multi-layer ceramic capacitor 10.

Figure 4B:
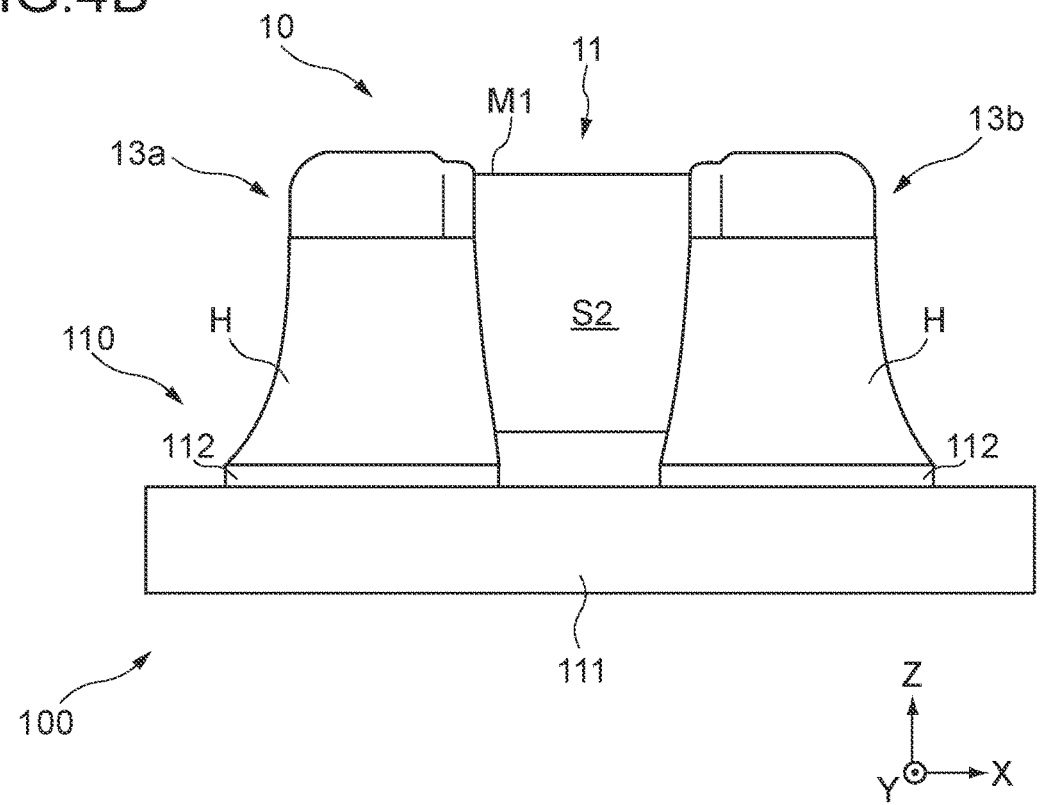
FIG. 4B is a side view of a circuit board on which the multi-layer ceramic capacitor is mounted.

Specifically, the solder H wets and spreads between the connection electrodes 112 and the first and second end external electrodes 13a and 13b and further spreads on the first and second end external electrodes 13a and 13b upward in the Z-axis direction. Subsequently, the temperature of the solder H is returned to room temperature and then solidified, and thus the circuit board 100 on which the multi-layer ceramic capacitor 10 is connected to the mounting board 110 via the solder H is obtained as shown in FIG. 4B.

In the circuit board 100, the presence of voids in the solder H causes a decrease in connection strength and an increase in connection resistance between the multi-layer ceramic capacitor 10 and the mounting board 110. Further, in the solder H in which voids are present, cracks are likely to occur from the voids, and a connection failure between the multi-layer ceramic capacitor 10 and the mounting board 110 is likely to occur.

Furthermore, in the solder H, the presence of voids leads to an increase in thermal resistance. Therefore, in the multi-layer ceramic capacitor 10, the presence of voids in the solder H may lead to insufficiency of heat dissipation property and may cause an excessive temperature increase during use. Thus, in the multi-layer ceramic capacitor 10, problems such as the deterioration in function and the occurrence of damage are likely to occur.

In contrast, in the multi-layer ceramic capacitor 10, the action of the protrusions 132 of the first and second end external electrodes 13a and 13b makes it difficult for air to be mixed in the process of wetting and spreading of the molten solder H onto the first and second end external electrodes 13a and 13b. Thus, in the circuit board 100 with the multi-layer ceramic capacitor 10, voids are less likely to be generated in the solder H.

Figure 5A:
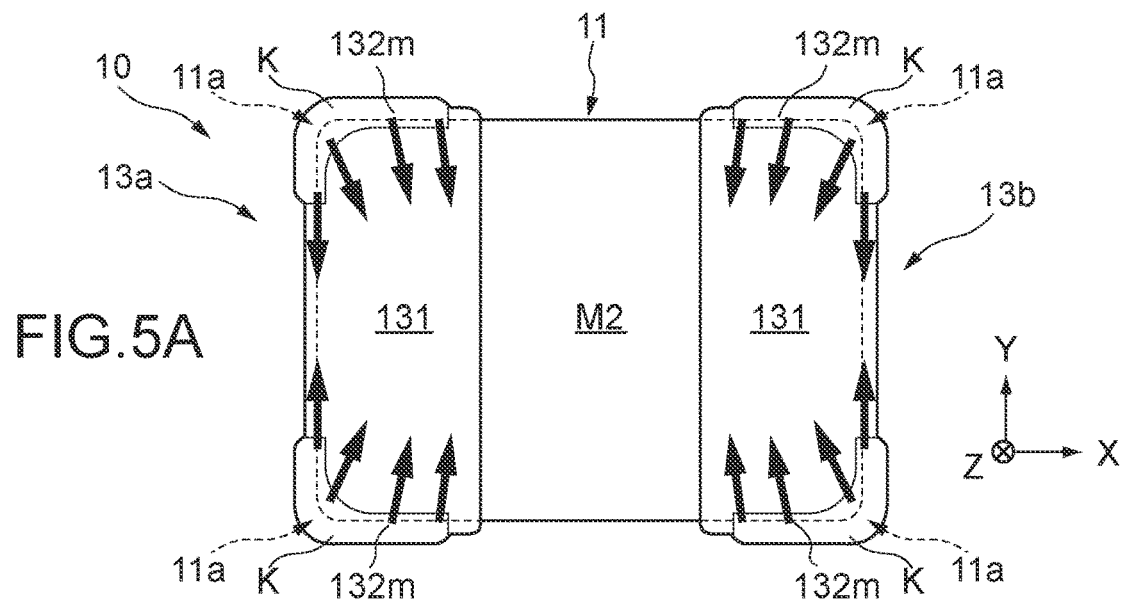
FIG. 5A is a view of the multi-layer ceramic capacitor as viewed from the bottom surface thereof.
Figure 5B:
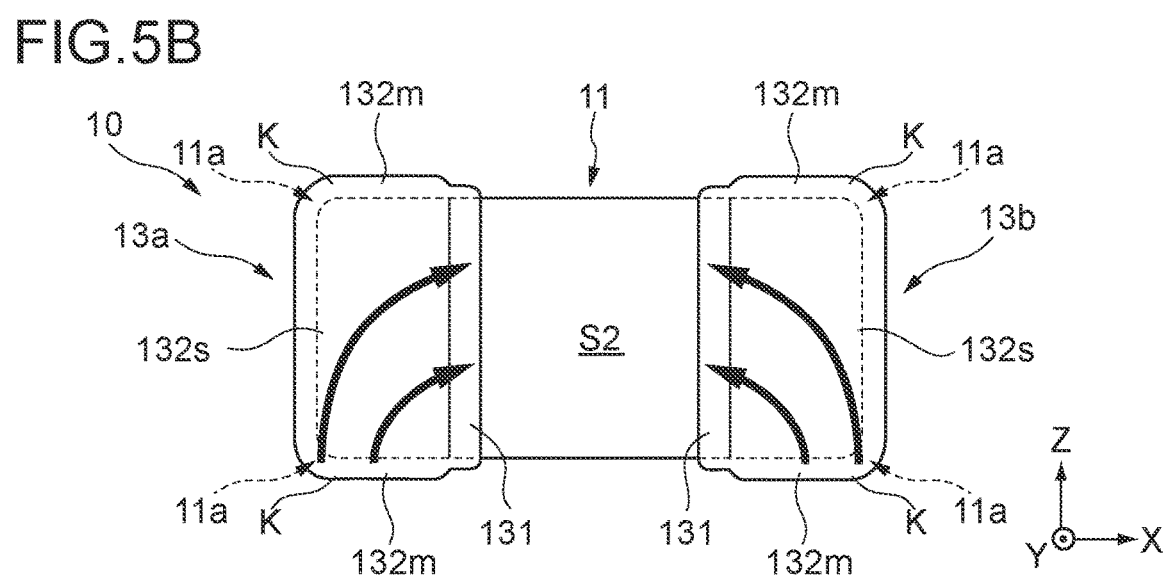
FIG. 5B is a view of the multi-layer ceramic capacitor as viewed from the side surface thereof.
Figure 5C:
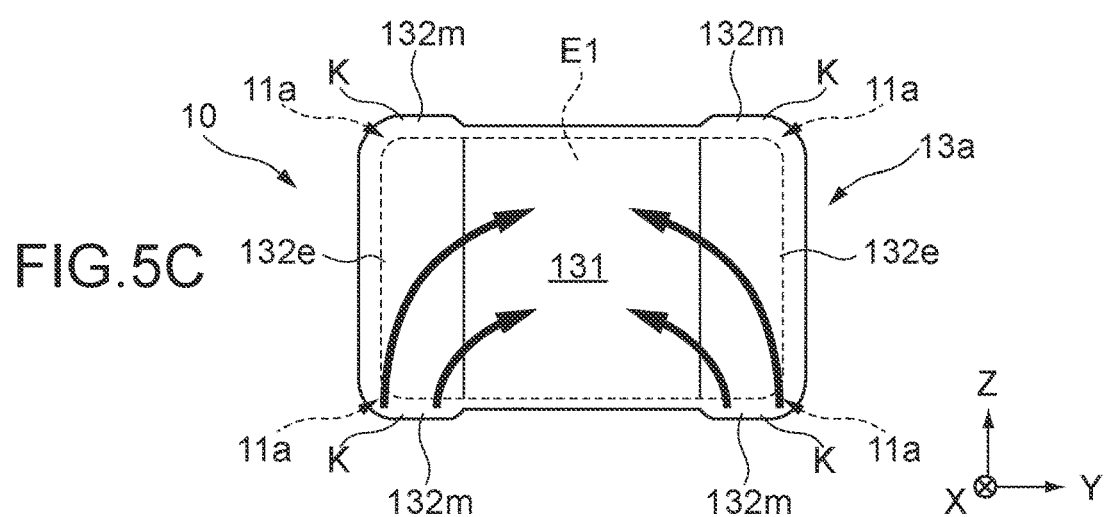
FIG. 5C is a view of the multi-layer ceramic capacitor as viewed from the end surface thereof.

FIGS. 5A to 5C schematically show, by using arrows, the flow when the molten solder H wets and spreads onto the first and second end external electrodes 13a and 13b. In the first and second end external electrodes 13a and 13b, the solder H wets and spreads starting from the main surface protrusions 132m, which protrude downward in the Z-axis direction toward the connection electrodes 112, on the second main surface M2 constituting the bottom surface of the multi-layer ceramic capacitor 10.

The main surface protrusion 132m is provided as a starting point at which the solder H wets and spreads, and thus a predetermined flow can be formed in the solder H wetting and spreading on the first and second end external electrodes 13a and 13b. This makes it possible to prevent incorporation of air, which tends to occur when the solder H wets and spreads from various unspecified positions on the first and second end external electrodes 13a and 13b at the same time.

FIG. 5A shows the multi-layer ceramic capacitor 10 viewed from the second main surface M2, the second main surface M2 constituting the bottom surface facing the mounting board 110. In each region of the first and second end external electrodes 13a and 13b on the second main surface M2, the solder H wets and spreads inward in the X- and Y-axis directions, from the main surface protrusions 132m on both sides in the Y-axis direction to the base portion 131.

At that time, in the regions of the first and second end external electrodes 13a and 13b on the second main surface M2, the L-shaped main surface protrusions 132m are disposed spaced apart from each other at the four corners in the X- and Y-axis directions. Each main surface protrusion 132m, which is formed of a dense metal, easily causes a temperature rise and easily stores heat by sufficiently coming into contact with the solder H, and thus quickly melts the solder H to be a starting point of wetting and spreading. Therefore, in the regions of the first and second end external electrodes 13a and 13b on the second main surface M2, the flow outward in the X- and Y-axis directions is less likely to occur in the solder H. Therefore, the solder H smoothly wets and spreads onto the first and second end external electrodes 13a and 13b without taking in air.

In such a manner, in the circuit board 100, voids are less likely to be generated at a portion sandwiched between each of the first and second end external electrodes 13a and 13b and the connection electrode 112, the portion most greatly affecting the connection state between the multi-layer ceramic capacitor 10 and the mounting board 110 in the solder H. This makes it possible to effectively prevent a decrease in connection reliability and heat dissipation property, which is caused by the voids generated in the solder H.

Note that, in the first and second end external electrodes 13a and 13b, the length of the portion extending in the X-axis direction in the L-shaped main surface protrusion 132m is made longer than the length of the portion along the Y-axis direction, which makes it easy to control the wetting and spreading of the solder H in the Y-axis direction. Further, the length of the portion extending in the Y-axis direction in the L-shaped main surface protrusion 132m is made longer than the length of the portion along the X-axis direction, which makes it easy to control the wetting and spreading of the solder H in the X-axis direction.

FIG. 5B shows the multi-layer ceramic capacitor 10 viewed from the second side surface S2. In the regions of the first and second end external electrodes 13a and 13b on each of the first and second side surfaces S1 and S2, the solder H wets upward in the Z-axis direction along the side surface protrusions 132s from the main surface protrusions 132m located on both sides in the X-axis direction and also wets and spreads onto the base portions 131 inward in the X-axis direction.

FIG. 5C shows the multi-layer ceramic capacitor 10 viewed from the first end surface E1. In the regions of the first and second end external electrodes 13a and 13b on each of the first and second end surfaces E1 and E2, the solder H wets upward in the Z-axis direction along the end surface protrusions 132e from the main surface protrusions 132m located on both sides in the Y-axis direction and also wets and spreads onto the base portions 131 inward in the Y-axis direction.

In such a manner, in any region of the first and second end external electrodes 13a and 13b on the first and second side surfaces S1 and S2 and the first and second end surfaces E1 and E2, it is possible to form a predetermined flow in the solder H. Thus, the voids are less likely to be formed also in the solder H, which has wetted upward around the first and second end external electrodes 13a and 13b, and thus it is possible to further effectively prevent a decrease in connection reliability and heat dissipation property.

Note that the shapes of the first and second end external electrodes 13a and 13b can be appropriately determined so as to be able to form an appropriate flow of the solder H.

For example, in the portions of the first and second end external electrodes 13a and 13b on the first and second main surfaces M1 and M2, the thickness of the base portion 131 is favorably 10 μm or more and 110 μm or less, and can be 50 μm as an example. Further, the thickness of the main surface protrusion 132m is favorably 13 μm or more and 160 μm or less, and can be 80 μm as an example. Furthermore, the amount of protrusion of the main surface protrusion 132m from the base portion 131 is favorably 3 μm or more and 50 μm or less, and more favorably 5 μm or more and 30 μm or less.

Further, in the portions of the first and second end external electrodes 13a and 13b on the first and second side surfaces S1 and S2, the thickness of the base portion 131 is favorably 10 μm or more and 110 μm or less, and can be 50 μm, for example. Further, the thickness of the side surface protrusion 132s is favorably 13 μm or more and 160 μm or less, and can be 80 μm as an example. Furthermore, the amount of protrusion of the side surface protrusion 132s from the base portion 131 is favorably 3 μm or more and 50 μm or less, and more favorably 5 μm or more and 30 μm or less.

Furthermore, in the portions of the first and second end external electrodes 13a and 13b on the first and second end surfaces E1 and E2, the thickness of the base portion 131 is favorably 15 μm or more and 125 μm or less, and can be 60 μm as an example. Further, the thickness of the end surface protrusion 132e is favorably 18 μm or more and 175 μm or less, and can be 90 μm as an example. Furthermore, the amount of protrusion of the end surface protrusion 132e from the base portion 131 is favorably 3 μm or more and 50 μm or less, and more favorably 5 μm or more and 30 μm or less.

Note that the thickness of each portion of the first and second end external electrodes 13a and 13b on each surface (first and second main surfaces M1 and M2, first and second side surfaces S1 and S2, and first and second end surfaces E1 and E2) can be measured, for example, at a position that is to be the center of gravity of the two-dimensional region occupied by each portion when viewed from a direction perpendicular to each surface.

In addition, in the main surface protrusion 132m of the multi-layer ceramic capacitor 10 having a dimension in the X-axis direction of 1370 μm and a dimension in the Y-axis direction of 800 μm, the main surface protrusion 132m favorably has a dimension in the X-axis direction of 100 μm or more and 250 μm or less, and a dimension in the Y-axis direction of 50 μm or more and 250 μm or less.

3. Production Method for Multi-Layer Ceramic Capacitor 10

Figure 6:
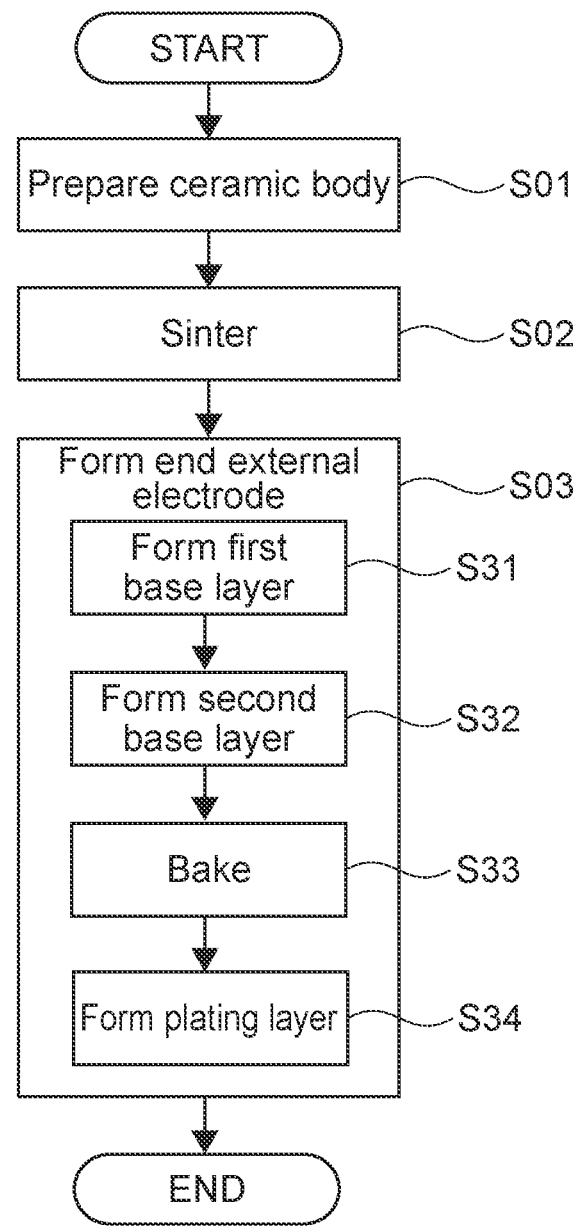
FIG. 6 is a flowchart showing a method of producing the multi-layer ceramic capacitor.

FIG. 6 is a flowchart showing an example of a production method for the multi-layer ceramic capacitor 10 according to this embodiment. FIGS. 7 to 9C are diagrams showing a production process for the multi-layer ceramic capacitor 10. Hereinafter, the production method for the multi-layer ceramic capacitor 10 will be described according to FIG. 6 with reference to FIGS. 7 to 9C as appropriate.

3.1 Step S01: Preparation of Ceramic Body

In Step S01, an unsintered ceramic body 11 is prepared. The unsintered ceramic body 11 is obtained by laminating and thermocompression-bonding a plurality of ceramic sheets in the Z-axis direction. By printing a conductive metal paste of a predetermined pattern on the ceramic sheets in advance, the internal electrodes 12a and 12b can be arranged.

The ceramic sheet is an unsintered dielectric green sheet obtained by forming ceramic slurry into a sheet shape. The ceramic sheet is formed into a sheet shape by using a roll coater or a doctor blade, for example. Components of the ceramic slurry are adjusted so as to obtain a ceramic body 11 with a predetermined composition.

3.2 Step S02: Sintering

In Step S02, the unsintered ceramic body 11 obtained in Step S01 is sintered. As a result, the ceramic body 11 is sintered, and the ceramic body 11 shown in FIG. 7 is obtained. Sintering of the ceramic body 11 can be performed in a reduction atmosphere or a low-oxygen partial pressure atmosphere, for example. The sintering conditions of the ceramic body 11 can be appropriately determined.

3.3 Step S03: Formation of First and Second End External Electrodes

In Step S03, the first and second end external electrodes 13a and 13b are formed on the ceramic body 11 obtained in Step S02. Thus, the multi-layer ceramic capacitor 10 shown in FIGS. 1 to 3 is completed. Step S03 includes four steps of Step S31, Step S32, Step S33, and Step S34.

3.3.1 Step S31: Formation of First Base Layer

In Step S31, first base layers L1 constituting the base layers of the first and second end external electrodes 13a and 13b are formed on the ceramic body 11. The first base layer L1 is provided at a position corresponding to the protrusion 132 of each of the first and second end external electrodes 13a and 13b. A conductive metal paste P is used to form the first base layer L1 in Step S31.

Figure 8A:
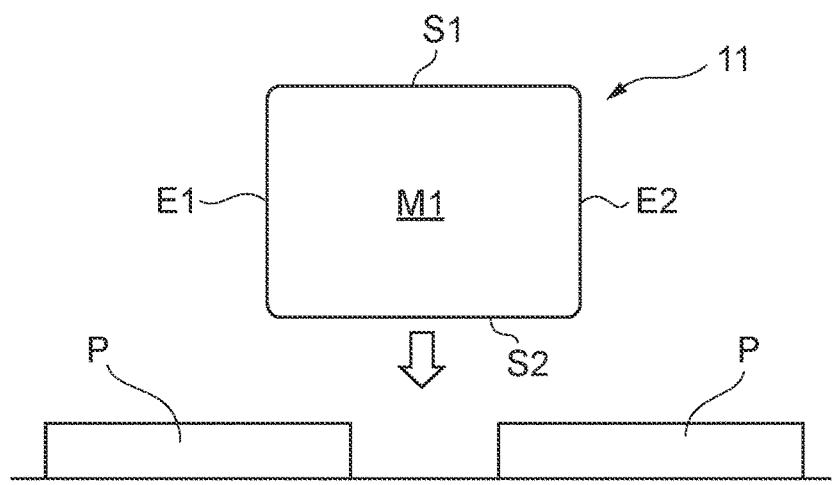
FIG. 8A is a diagram showing Step S31.
Figure 8B:
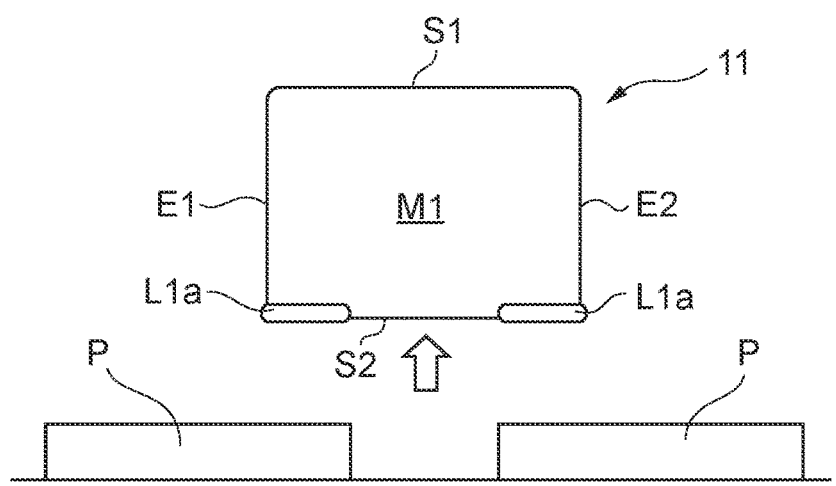
FIG. 8B is a diagram showing Step S31.

FIGS. 8A to 8F show the process of forming the first base layers L1 on the ceramic body 11 in Step S31. First, as shown in FIG. 8A, the second side surface S2 of the ceramic body 11 is immersed in the conductive metal paste P, which is disposed at two locations spaced apart from each other. As a result, the conductive metal paste P adheres to the second side surface S2 of the ceramic body 11, and thus intermediate films Lia as part of the first base layers L1 are formed as shown in FIG. 8B.

Figure 8C:
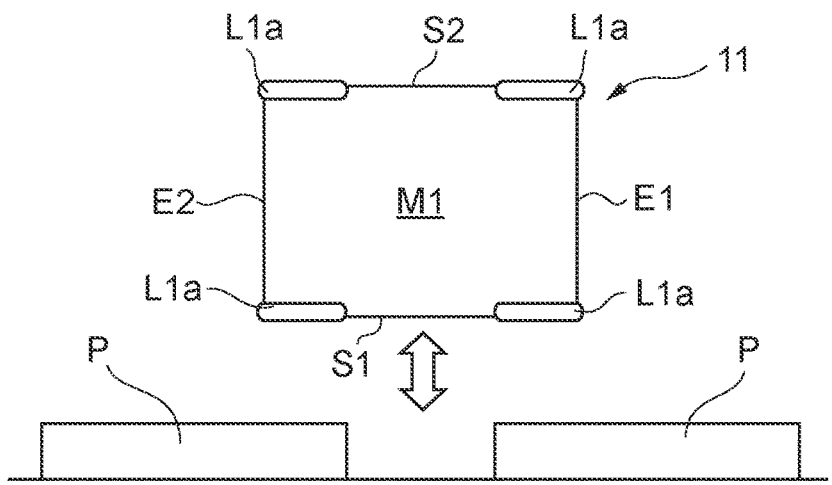
FIG. 8C is a diagram showing Step S31.

Similarly, as shown in FIG. 8C, the first side surface S1 of the ceramic body 11 is immersed in the conductive metal paste P, and thus intermediate films L1a as part of the first base layer L1 are also formed on the first side surface S1 of the ceramic body 11. Thus, the intermediate films L1a are formed at four positions on the surfaces of the ceramic body 11.

Figure 8D:
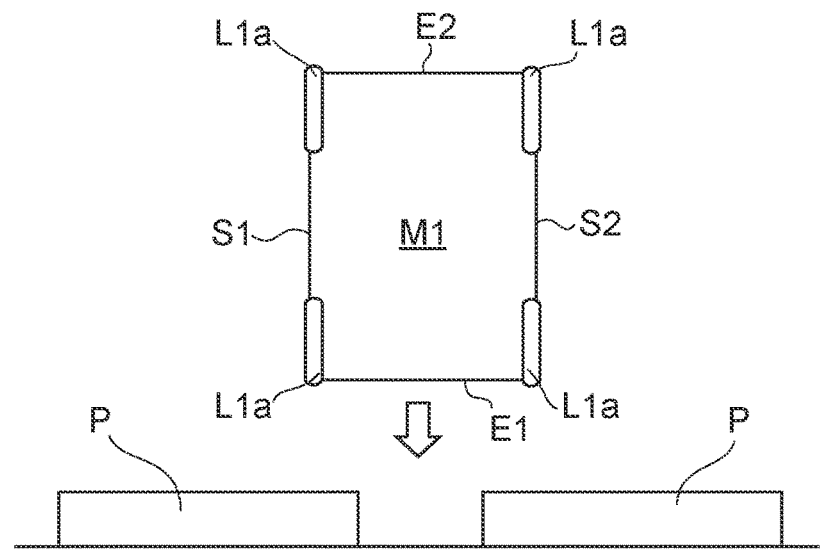
FIG. 8D is a diagram showing Step S31.
Figure 8E:
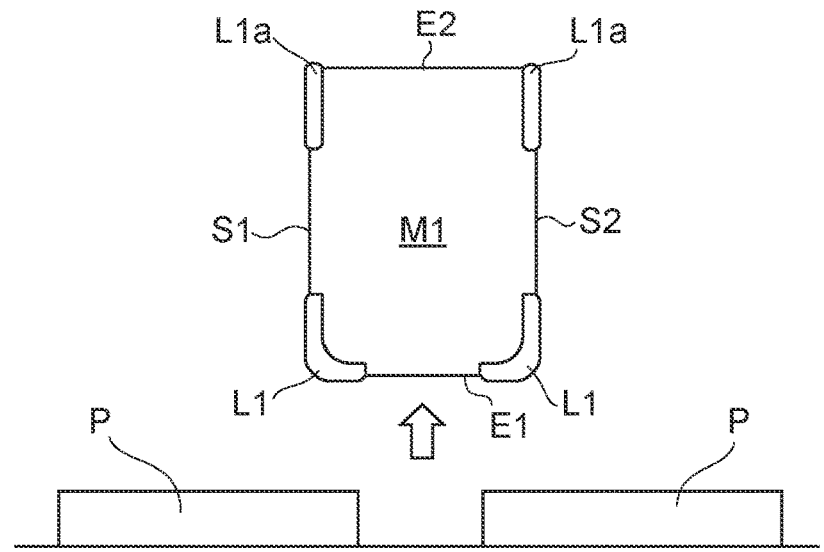
FIG. 8E is a diagram showing Step S31.

Next, as shown in FIG. 8D, the first end surface E1 of the ceramic body 11 is immersed in the conductive metal paste P, which is disposed at two locations spaced apart from each other. As a result, the conductive metal paste P adheres to the first end surface E1 of the ceramic body 11 and is integrated with the conductive metal paste P constituting the intermediate films L1a, so that L-shaped first base layers L1 are formed as shown in FIG. 8E.

Figure 8F:
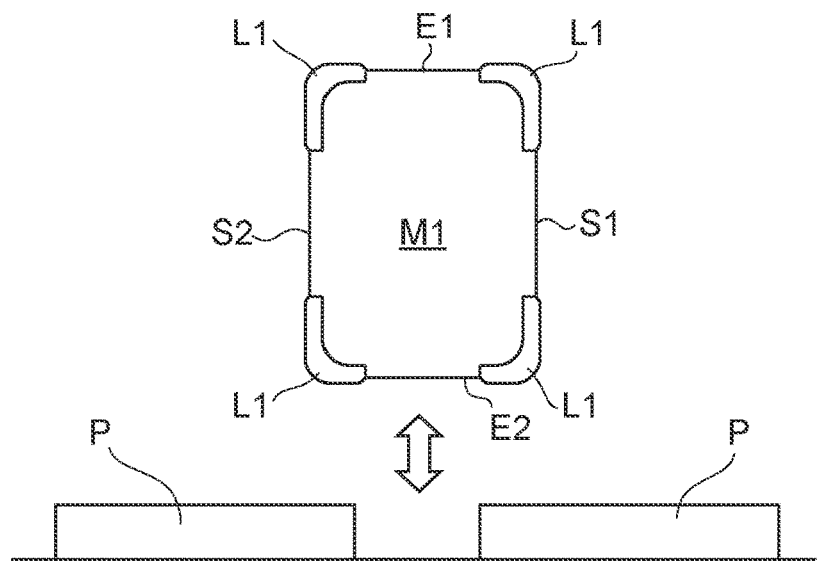
FIG. 8F is a diagram showing Step S31.

Similarly, as shown in FIG. 8F, the second end surface E2 of the ceramic body 11 is immersed in the conductive metal paste P, so that L-shaped first base layers L1 are also formed on the second end surface E2. As a result, the first base layers L1 are formed at four locations on the surfaces of the ceramic body 11.

Note that the conditions of Step S31 can be determined as appropriate. For example, the viscosity of the conductive metal paste P can be 320 PS. The immersion time of the ceramic body 11 in the conductive metal paste P can be 1.5 seconds. Further, the first base layers L1 obtained after the immersion can be dried under a predetermined condition.

3.3.2 Step S32: Formation of Second Base Layer

In Step S32, a second base layer L2 constituting the base layer of each of the first and second end external electrodes 13a and 13b is formed, together with the first base layers L1, on the ceramic body 11 on which the first base layers L1 are formed. The second base layer L2 is provided over the entire first and second end external electrodes 13a and 13b. The conductive metal paste P is used to form the second base layer L2 in Step S32.

Figure 9A:
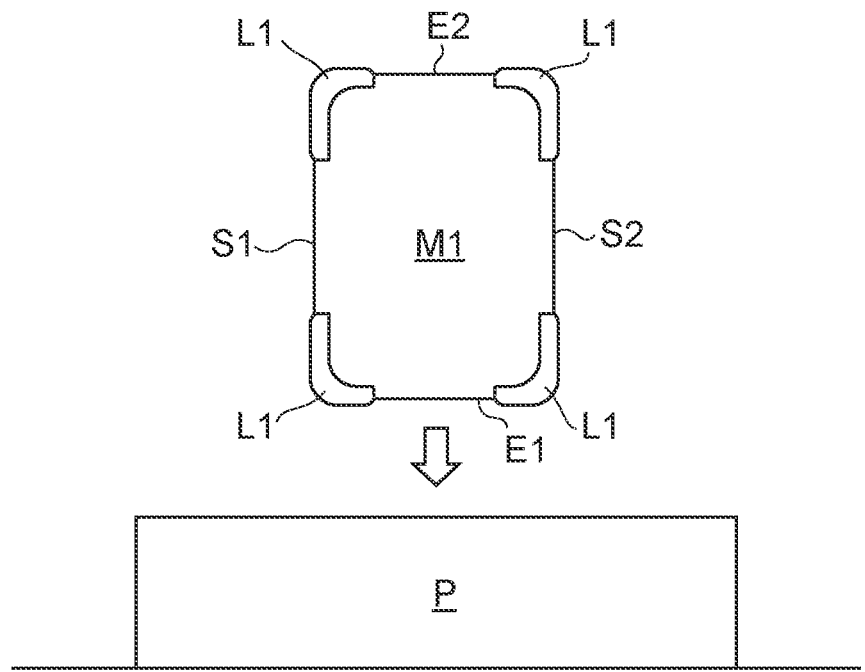
FIG. 9A is a diagram showing Step S32.
Figure 9B:
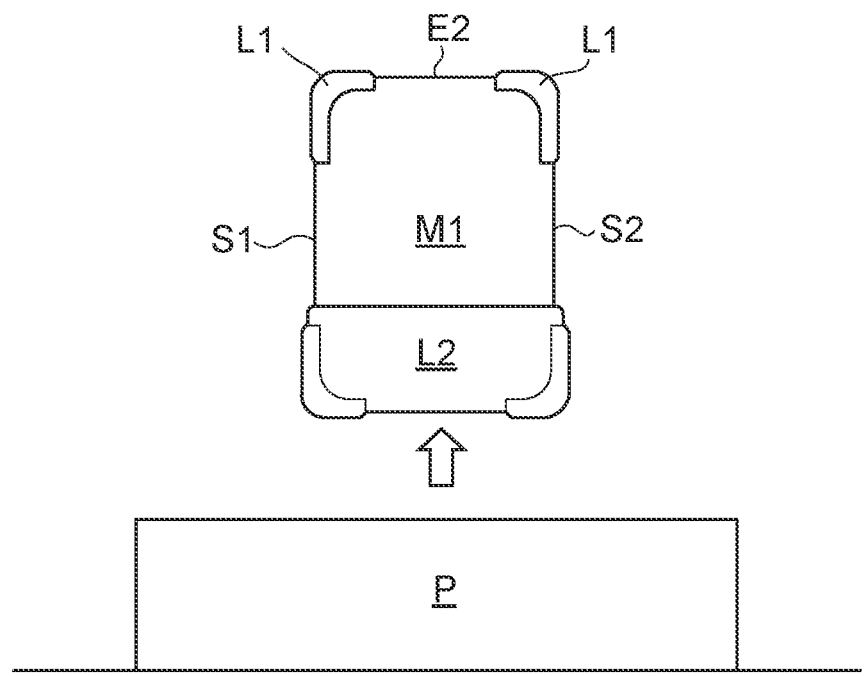
FIG. 9B is a diagram showing Step S32.
Figure 9C:
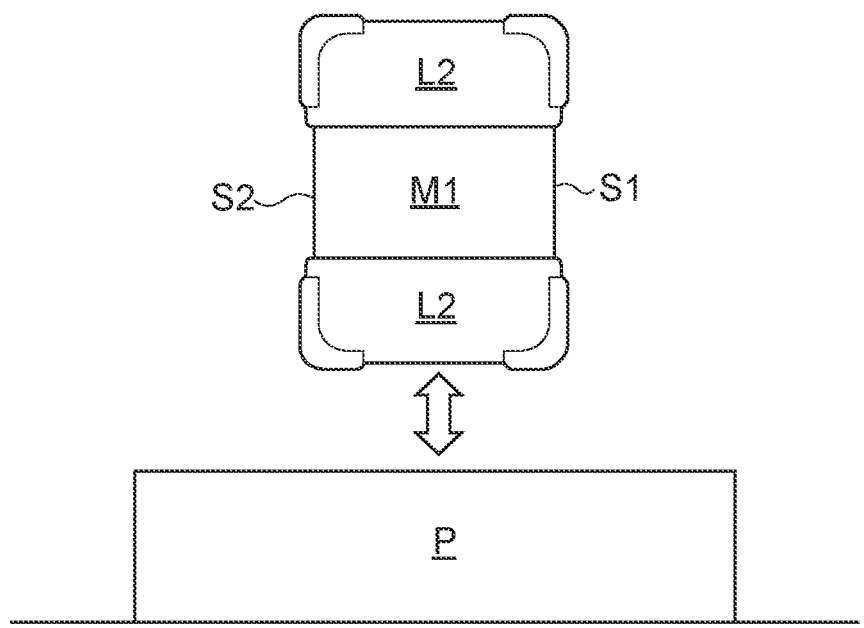
FIG. 9C is a diagram showing Step S32.

FIGS. 9A to 9C show the process of forming the second base layer L2 on the ceramic body 11 in Step S32. First, as shown in FIG. 9A, the ceramic body 11 is immersed in the conductive metal paste P from the first end surface E1 to a position where the first base layers L1 sink, to cause the conductive metal paste P to adhere to the ceramic body 11 and the first base layers L1.

Thus, as shown in FIG. 9B, the second base layer L2 that covers the first end surface E1 of the ceramic body 11 from above the first base layers L1 is formed. In the first and second base layers L1 and L2 formed on the ceramic body 11, the portion of only the second base layer L2 corresponds to the base portion 131, and the portion where the first and second base layers L1 and L2 overlap each other corresponds to the protrusion 132.

Similarly, as shown in FIG. 9C, the ceramic body 11 is immersed in the conductive metal paste P from the second end surface E2 to a position where the first base layers L1 sink, and thus the second base layer L2 is also formed on the second end surface E2, similarly to the first end surface E1. Thus, the outer shape of the base portion 131 and the protrusion 132 of each of the first and second end external electrodes 13a and 13b is obtained.

Note that the conditions of Step S32 can be determined as appropriate. For example, the viscosity of the conductive metal paste P can be 320 PS. The immersion time of the ceramic body 11 in the conductive metal paste P can be 1.5 seconds. Further, the second base layers L2 obtained after the immersion can be dried under a predetermined condition. In addition, the order of forming the first and second base layers L1 and L2 may be opposite to the order described above. In other words, Step S32 may be performed before Step S31.

3.3.3 Step S33: Baking

In Step S33, the first and second base layers L1 and L2 formed on the ceramic body 11 are baked by heat treatment. Note that if Steps S31 and S32 are performed prior to Step S02, the sintering of the ceramic body 11 in Step S02 and the baking of the first and second base layers L1 and L2 in Step S33 can be performed in one heat treatment.

3.3.4 Step S34: Formation of Plating Layer

In Step S34, plating layers are formed by wet plating treatment on the first and second base layers L1 and L2 baked onto the ceramic body 11. Thus, the first and second end external electrodes 13a and 13b are completed. Since the plating layers having a uniform thickness are formed by the wet plating treatment, the shape of the first and second base layers L1 and L2 as described above is maintained in the first and second end external electrodes 13a and 13b.

3.4 Modified Examples

The production method described above can be variously modified as long as the configuration of the multi-layer ceramic capacitor 10 of this embodiment can be obtained. For example, the method of forming the first and second end external electrodes 13a and 13b is not limited to the above-described method of forming the first and second base layers L1 and L2 as long as the base portion 131 and the protrusion 132 can be formed.

4. Other Embodiments

While the embodiment of the present disclosure has been described, the present disclosure is not limited to the embodiment described above, and it should be appreciated that the present disclosure may be variously modified.

For example, the protrusion 132 of each of the first and second end external electrodes 13a and 13b only needs to include at least the main surface protrusion 132m, and does not need to include at least one of the side surface protrusion 132s or the end surface protrusion 132e. Also in this case, it is possible to suppress a decrease in connection reliability and heat dissipation property, which is caused by the voids generated in the solder H. Further, the protrusion 132 is favorably provided in all of the four corners in the X- and Y-axis directions, but it only needs to be provided at at least one corner.

Figure 10:
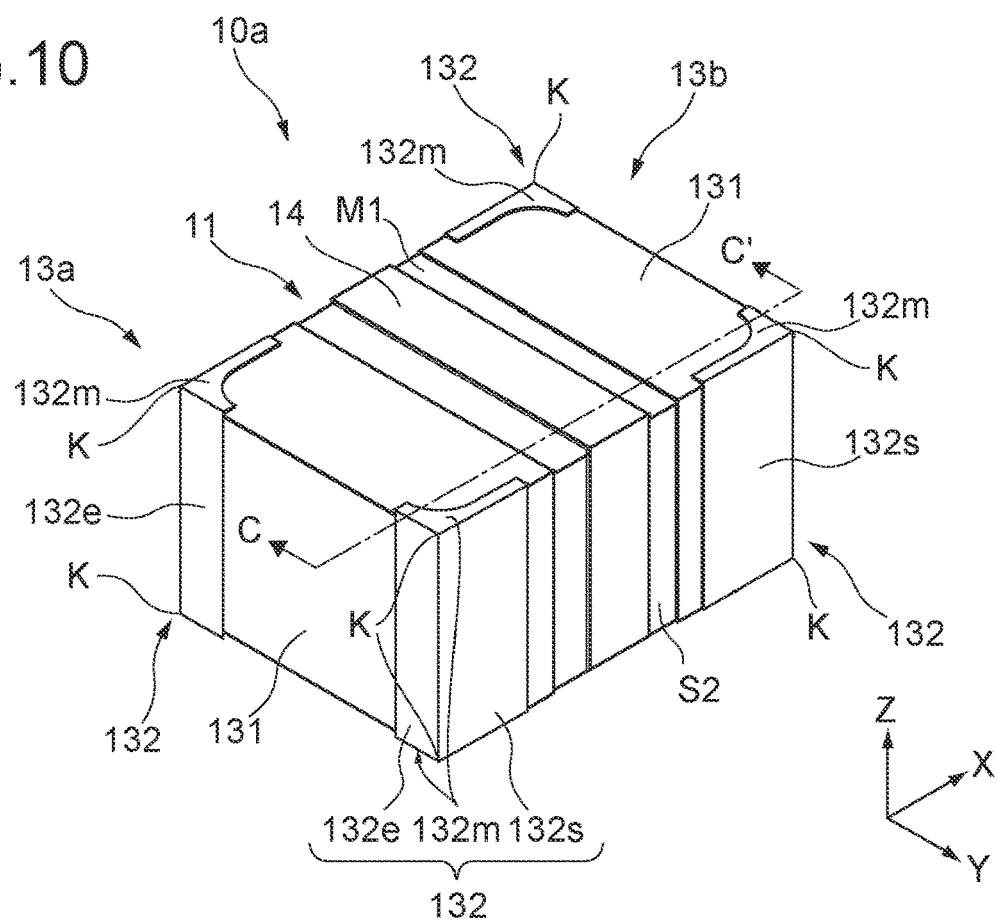
FIG. 10 is a perspective view of a multi-layer ceramic capacitor according to another embodiment.
Figure 11:
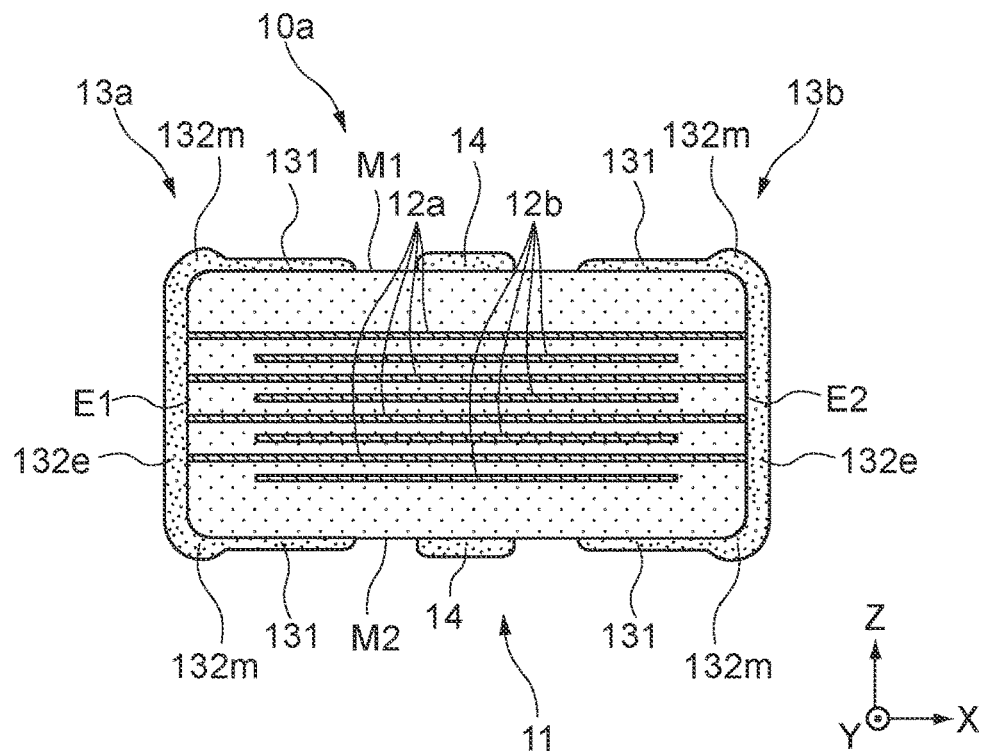
FIG. 11 is a cross-sectional view of the multi-layer ceramic capacitor according to the other embodiment taken along the line C-C' in FIG. 10.

Further, the multi-layer ceramic capacitor according to this embodiment is not limited to be of a two-terminal type, and can also be configured to be of a three-terminal type. FIGS. 10 and 11 show a multi-layer ceramic capacitor 10a of the three-terminal type. The multi-layer ceramic capacitor 10a includes a central external electrode 14 provided at the central portion of the ceramic body 11 in the X-axis direction.

The central external electrode 14 is provided over the entire circumference of the ceramic body 11 along the first and second main surfaces M1 and M2 and the first and second side surfaces S1 and S2. In the multi-layer ceramic capacitor 10a, all first internal electrodes 12a are connected to the first and second end external electrodes 13a and 13b, and all second internal electrodes 12b are connected to the central external electrode 14.

In the multi-layer ceramic capacitor 10a, the thickness of the central external electrode 14 on each of the first and second main surfaces M1 and M2 is favorably smaller than the thickness of the main surface protrusion 132m on each of the first and second main surfaces M1 and M2. Thus, the above-mentioned formation of the flow of the solder H starting from the main surface protrusion 132m during mounting is less likely to be hindered by the presence of the central external electrode 14.

Further, in the multi-layer ceramic capacitor 10a, the thickness of the central external electrode 14 on each of the first and second main surfaces M1 and M2 is favorably larger than the thickness of the base portion 131 on each of the first and second main surfaces M1 and M2. Thus, in the multi-layer ceramic capacitor 10a, it is possible to bring the central external electrode 14 into contact with the solder H more reliably on the connection electrode 112 of the mounting board 110 during mounting.

Note that the multi-layer ceramic capacitor 10a of the three-terminal type is not limited to a configuration in which the central external electrode 14 is provided over the entire circumference of the ceramic body 11 along the first and second main surfaces M1 and M2 and the first and second side surfaces S1 and S2. For example, in the multi-layer ceramic capacitor 10a, the central external electrodes 14 may be spaced apart from each other in the Y-axis direction on the first and second main surfaces M1 and M2 of the ceramic body 11.

Furthermore, the present disclosure is applicable not only to the multi-layer ceramic capacitors but also to any other multi-layer ceramic electronic components each including end external electrodes. Examples of such multi-layer ceramic electronic components to which the present disclosure is applicable include a chip varistor, a chip thermistor, and a multi-layer inductor, in addition to the multi-layer ceramic capacitors.

It will be apparent to those skilled in the art that various modifications and variations can be made in the present disclosure without departing from the spirit or scope of the disclosure. Thus, it is intended that the present disclosure cover modifications and variations that come within the scope of the appended claims and their equivalents. In particular, it is explicitly contemplated that any part or whole of any two or more of the embodiments and their modifications described above can be combined and regarded within the scope of the present disclosure.

What is claimed is:

1. A multi-layer ceramic electronic component, comprising:
    a ceramic body including
        a main surface, an end surface, and a side surface that are respectively perpendicular to a first axis, a second axis, and a third axis orthogonal to one another,
        a top portion that connects the main surface, the end surface, and the side surface to one another, and
        a plurality of internal electrodes laminated in a direction of the first axis; and
    an end external electrode including
        a corner portion located on the top portion,
        a base portion that covers the end surface and extends from the end surface to the main surface and the side surface, and
        a protrusion that protrudes from the base portion in a thickness direction, the protrusion including an L-shaped main surface protrusion that is located on the main surface and extends in a direction of the second axis and in a direction of the third axis from the corner portion.

2. The multi-layer ceramic electronic component according to claim 1, wherein
    an amount of protrusion of the main surface protrusion from the base portion is 3 μm or more and 50 μm or less.

3. The multi-layer ceramic electronic component according to claim 1, wherein
    an amount of protrusion of the main surface protrusion from the base portion is 5 μm or more and 30 μm or less.

4. The multi-layer ceramic electronic component according to claim 1, wherein
    the protrusion further includes an end surface protrusion extending in the direction of the first axis from the main surface protrusion along the end surface.

5. The multi-layer ceramic electronic component according to claim 4, wherein
    an amount of protrusion of the end surface protrusion from the base portion is 3 μm or more and 50 μm or less.

6. The multi-layer ceramic electronic component according to claim 1, wherein
    the protrusion further includes a side surface protrusion extending in the direction of the first axis from the main surface protrusion along the side surface.

7. The multi-layer ceramic electronic component according to claim 6, wherein
    an amount of protrusion of the side surface protrusion from the base portion is 3 μm or more and 50 μm or less.

8. The multi-layer ceramic electronic component according to claim 1, further comprising
    a central external electrode that is provided along the main surface and the side surface at the central portion of the ceramic body in the direction of the second axis and has a thickness on the main surface, which is larger than a thickness of the base portion and smaller than a thickness of the main surface protrusion.

9. The multi-layer ceramic electronic component according to claim 1, wherein
    the base portion and the protrusion have a common main component.

10. The multi-layer ceramic electronic component according to claim 1, wherein
    the main component of the protrusion has a smaller Young's modulus than the main component of the base portion.

11. A circuit board, comprising:
    a multi-layer ceramic electronic component; and
    a mounting board including a connection electrode,
    the multi-layer ceramic electronic component including
        a ceramic body including
            a main surface, an end surface, and a side surface that are respectively perpendicular to a first axis, a second axis, and a third axis orthogonal to one another,
            a top portion that connects the main surface, the end surface, and the side surface to one another, and
            a plurality of internal electrodes laminated in a direction of the first axis, and
        an end external electrode including
            a corner portion located on the top portion,
            a base portion that covers the end surface and extends from the end surface to the main surface and the side surface, and
            a protrusion that protrudes from the base portion in a thickness direction,
    the end external electrode being to be connected to the connection electrode of the mounting board via solder, the protrusion including an L-shaped main surface protrusion that is located on the main surface and extends in a direction of the second axis and in a direction of the third axis from the corner portion.

\* \* \* \* \*